(12) United States Patent
Shah et al.

(10) Patent No.: US 7,615,393 B1
(45) Date of Patent: Nov. 10, 2009

(54) METHODS OF FORMING MULTI-DOPED JUNCTIONS ON A SUBSTRATE

(75) Inventors: Sunil Shah, Union City, CA (US); Malcolm Abbott, Sunnyvale, CA (US)

(73) Assignee: Innovalight, Inc., Sunnyvale, CA (US)

( * ) Notice: Subject to any disclaimer, the term of this patent is extended or adjusted under 35 U.S.C. 154(b) by 0 days.

(21) Appl. No.: 12/260,507

(22) Filed: Oct. 29, 2008

(51) Int. Cl.
*H01L 21/00* (2006.01)

(52) U.S. Cl. ............................ 438/48; 438/57; 438/49; 438/476; 438/542; 438/557; 438/558; 438/563

(58) Field of Classification Search ........................ None
See application file for complete search history.

(56) References Cited

U.S. PATENT DOCUMENTS

| | | | |
|---|---|---|---|
| 4,404,735 A | 9/1983 | Sakurai | |
| 6,084,175 A | 7/2000 | Perry et al. | |
| 7,135,350 B1 | 11/2006 | Smith et al. | |
| 7,192,873 B1 * | 3/2007 | Kim et al. | 438/702 |
| 7,355,238 B2 * | 4/2008 | Takata et al. | 257/314 |
| 7,411,255 B2 | 8/2008 | Parekh et al. | |
| 7,419,887 B1 * | 9/2008 | Quick et al. | 438/479 |
| 2008/0160265 A1 | 7/2008 | Hieslmeir et al. | |
| 2008/0160733 A1 | 7/2008 | Hieslmeir et al. | |

OTHER PUBLICATIONS

"Lecture 5—Carrier generation and recombination (cont.)," Sep. 12, 2001, *6.720J/3.43J—Integrated Microelectric Devices*, pp. 5-1-5-17; MIT OpenCourseWare, Mass. Inst. of Tech.; http://mitocw.udsm.ac.tz/NR/rdonlyres/Electrical-Engineering-and-Computer-Science/6-720JIntegrated-Microelectronic-DevicesFall2002/3E14B40D-EE79-478E-ACB0-57CF8288DBF7/0/lecture5.pdf, printed from Website on Aug. 15, 2008.

(Continued)

*Primary Examiner*—Zandra Smith
*Assistant Examiner*—Khanh B Duong
(74) *Attorney, Agent, or Firm*—Foley & Lardner LLP

(57) ABSTRACT

A method of forming a multi-doped junction on a substrate is disclosed. The method includes providing the substrate doped with boron, the substrate including a first substrate surface with a first surface region and a second surface region. The method also includes depositing a first set of nanoparticles on the first surface region, the first set of nanoparticles including a first dopant. The method further includes heating the substrate in an inert ambient to a first temperature and for a first time period creating a first densified film, and further creating a first diffused region with a first diffusion depth in the substrate beneath the first surface region. The method also includes exposing the substrate to a diffusion gas including phosphorous at a second temperature and for a second time period creating a PSG layer on the first substrate surface and further creating a second diffused region with a second diffusion depth in the substrate beneath the second surface region, wherein the first diffused region is proximate to the second diffused region. The method further includes exposing the substrate to a oxidizing gas at a third temperature and for a third time period, wherein a SiO2 layer is formed between the PSG layer and the substrate surface, wherein the first diffusion depth is substantially greater than the second diffusion depth.

31 Claims, 15 Drawing Sheets

OTHER PUBLICATIONS

Serra, J. M. et al., "A study on selective emitter formation through an oxide mask for silicon solar cells," 4 pages, Physics Dep., University of Lisbon, Portugal; http://solar.fc.ul.pt/lafspapers/selectivemiter.pdf; available at least as of Aug. 15, 2008.

Hylton, J. D. et al., "Absorption in Thin Textured Silicon Wafers," Netherlands Energy Research Foundation ECN, 4 pages, The Netherlands; ftp://ftp.ecn.nl/pub/www/library/conf/14epsec/hylton.pdf; available at least as of Sep. 11, 2008.

"Chapter 5: Solid State Diffusion"; http://www.uio.no/studier/emner/matnat/kjemi/KJM5120/v05/undervisningsmateriale/KJM5120-Ch5-Diffusion.pdf, available at least as of Aug. 13, 2008.

"Silicon Dioxide," http://www.ece.gatech.edu/research/labs/vc/theory/oxide.html, pp. 1-6; printed Aug. 13, 2008.

Tool, C. J. J. et al., "Solar Cells On N-Type Multicrystalline Silicon Wagers by Industrial Processing Techniques," 2.CV.2.34, presented at the $19^{th}$ EU PVSEC, Jun. 2004, Paris.

van der Heide, A. S. H. et al., "Explanation of high solar cell diode factors by non-uniform contact resistance," 2004, 16 pages; published by John Wiley & Sons Ltd.; www.sunlab.nl/fileadmin/sunlab/user/publications/pip2004,pdf; available at least as of Sep. 16, 2008.

Dag, A. et al., "Performing STI process control using large-spot-size Fourier-transform reflectometry," http://www.micromagazine.com/archive/03/04/dag.html, 8 pages, printed Sep. 11, 2008.

"Wafer Fab: Dielectric" printout, http://www.siliconfareast.com/dielectric.htm; printed Aug. 13, 2008.

Nast Hartley, O. et al., "Investigation of Thin Aluminium Films on the Rear of Monocrystalline Silicon Solar Cells for Back Surface Field Formation," Oral paper 103.2 presented at the $29^{th}$ IEEE PVSC, New Orleans, May 20-24, 2002; 4 pages.

Sopori, B., "Silicon Nitride Coatings for Si Solar Cells: Control of Optical Reflection and Surface/Bulk Passivation," National Renewable Energy Laboratory, Golden, CO; http://www.electrochem.org/dl/ma/203/pdfs/0365.pdf; available at least as of Sep. 11, 2008.

Dobkin, D. M., "Boron and Phosphorus Diffusion in $SiO_2$ and $SiO_xN_y$," http://www.enigmatic-consulting.com/semiconductor_processing/selected_shorts/B_and_P, pp. 1-9, printed Aug. 13, 2008.

Raabe, B. et al., "Monocrystalline Silicon—Future Cell Concepts," 5 pages: http://www.uni-konstanz.de/pv/publikationen/papers/milan2007/2DO_2_5_Raabe_preprint_Milan2007.pdf; available at least as of Aug. 15, 2008.

Neuhaus, D.-H. et al., "Review Article: Industrial Silicon Wafer Solar Cells," *Advances in OptoElectronics*, vol. 2007, Article ID 24521, pp. 1-15; Hindawi Publishing Corporation.

Jones, S. W., "Diffusion in Silicon," copyright © 2000 IC Knowledge LLC, pp. 1-68; http://www.icknowledge.com/misc-technology/miscellaneous_technology, available at least as of Aug. 13, 2008.

* cited by examiner

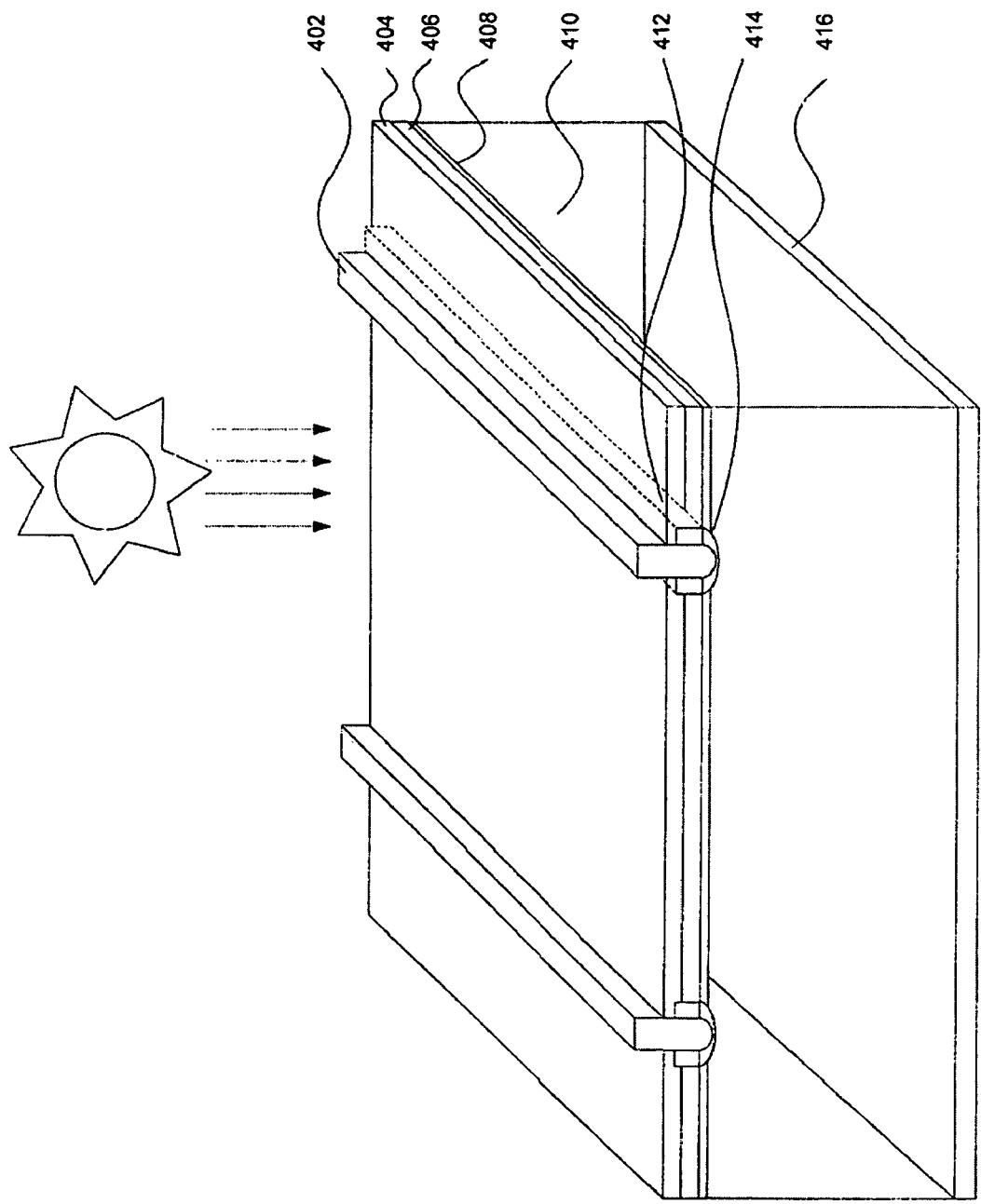

METHODS OF FORMING MULTI-DOPED JUNCTIONS ON A SUBSTRATE

FIELD OF DISCLOSURE

This disclosure relates in general to p-n junctions and in particular to methods of forming multi-doped junctions on a substrate.

BACKGROUND

Semiconductors form the basis of modern electronics. Possessing physical properties that can be selectively modified and controlled between conduction and insulation, semiconductors are essential in most modern electrical devices (e.g., computers, cellular phones, photovoltaic cells, etc.).

One of the most useful semiconductor structures is the p-n junction. The basic building block of many electronic and electrical devices, the p-n junction tends to conduct an electric current in one direction and blocks it in the other, and tends to generate an electric field. This last property is useful for charge extraction applications such as solar cells.

In a typical solar cell, absorbed light will generally create an electron-hole pair. Electrons on the p-type side of the junction within the electric field (or built-in potential) may then be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc. The built-in potential and thus magnitude of electric field generally depend on the level of doping between two adjacent layers.

Most solar cells are generally formed on a silicon wafer doped with a first dopant (commonly boron) forming an absorber region, upon which a second counter dopant (commonly phosphorous) is diffused forming the emitter region, in order to complete the p-n junction. After the addition of passivation and antireflection coatings, metal contacts (fingers and busbar on the emitter, and pads on the back of the absorber) may be added in order to extract generated charge. Emitter dopant concentration, in particular, must be optimized for both carrier collection and for contact with the metal electrodes.

In general, a low concentration of dopant atoms within an emitter region will result in both low recombination (thus higher solar cell efficiencies), and poor electrical contact to metal electrodes. Conversely, a high concentration of dopant atoms will result in both high recombination (reducing solar cell efficiency), and low resistance ohmic contacts to metal electrodes. Often, in order to reduce manufacturing costs, a single dopant diffusion is generally used to form an emitter, with a doping concentration selected as a compromise between recombination and ohmic contact. Consequently, potential solar cell efficiency (the percentage of sunlight that is converted to electricity) is reduced.

One solution is the use of a dual-doped or selective-emitter. A selective emitter uses a first lightly doped region optimized for low recombination, and a second heavily doped region (of the same dopant type) optimized for low resistance ohmic metal contact. However, a selective-emitter configuration may be difficult to achieve in a one-step diffusion process and may involve several masking steps, consequently increasing manufacturing costs. In addition, since there are generally no visual boundaries between high doped and low doped emitter regions, the alignment of a metal contact onto a previously deposited highly doped region may be difficult.

Like the emitter region, the deposition of a BSF (back surface field) may also be problematic. A BSF is generally a region located at the rear of a solar cell which tends to repel minority carriers in the absorber region from high recombination zones at the rear surface and metallized regions of the wafer. In general a BSF may be formed using dopants of the same type as those used in the absorber region, in this case the concentration of dopant atoms in the BSF is selected to be higher than that used to dope the absorber region, thus creating a potential barrier between the bulk of the wafer and the rear surface.

In addition, in a typical solar cell structure the BSF is generally formed using aluminum (or other deposited materials) which is generally first screen printed onto the back of a solar cell and then co-fired in a belt furnace along with the front side metal contacts (commonly formed from screen printed silver paste). Typically, silicon atoms in the wafer tend to diffuse in the aluminum and subsequently recrystallize, incorporating aluminum atoms into the silicon crystal. However, although relatively easy to manufacture, the thermal expansion coefficient of aluminum (about 24 µm/m° C.) is much greater than silicon (about 3 µm/m° C.). Consequently, wafer bowing tends to occur. And while some reduction in carrier recombination is achieved with the screen printed Al BSF, there is still significant recombination occurring at the rear which tends to reduce solar cell efficiency.

Alternatively, the rear surface may be passivated by the diffusion of dopant atoms of the opposite type (counter dopant) to those used in the absorber region. In this case a floating junction is established at the rear side of the substrate which has been shown to also provide effective passivation. A second diffused region must generally be used to provide ohmic contact to the absorber region of the solar cell.

Finally it is possible to use a localized heavily doped region to form ohmic contacts only over a small region of the rear surface and to reduce recombination in other regions using surface passivation layers (e.g. SiNx, $TiO_2$, $SiO_2$). In this case the surface layers both reduce the recombination sites at the surface of the silicon as well as providing fixed charge that repels minority carriers from the surface. Similar to the formation of the high efficiency emitter (e.g. selective emitter), formation of an effective BSF often involves many processing steps and is therefore often too costly for manufacturing.

In view of the foregoing, there is a desire to provide an optimized method of forming multi-doped junctions on a substrate.

SUMMARY

The invention relates, in one embodiment, to a method of forming a multi-doped junction on a substrate. The method includes providing the substrate doped with boron, the substrate including a first substrate surface with a first surface region and a second surface region. The method also includes depositing a first set of nanoparticles on the first surface region, the first set of nanoparticles including a first dopant. The method further includes heating the substrate in an inert ambient to a first temperature and for a first time period creating a first densified film, and further creating a first diffused region with a first diffusion depth in the substrate beneath the first surface region. The method also includes exposing the substrate to a diffusion gas including phosphorous at a second temperature and for a second time period creating a PSG layer on the first substrate surface and further creating a second diffused region with a second diffusion depth in the substrate beneath the second surface region, wherein the first diffused region is proximate to the second diffused region. The method further includes exposing the substrate to a oxidizing gas at a third temperature and for a third time period, wherein a SiO2 layer is formed between the PSG layer and the substrate surface, wherein the first diffusion depth is substantially greater than the second diffusion depth.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4 shows a simplified diagram of a solar cell with a selective emitter and aluminum BSF, in accordance with the invention;

DETAILED DESCRIPTION

Figure 1A:
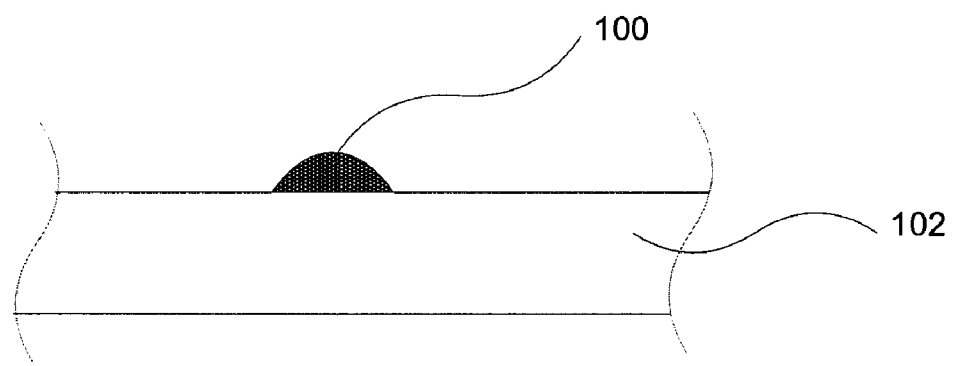
FIGS. 1A-F show a simplified set of diagrams of an optimized method for forming a multi-doped junction on a substrate with a simultaneous diffusion step, in accordance with the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, forming multi-doped junctions on a substrate, such as for a solar cell, tends to be problematic since multiple separate diffusions and patterning steps are often required, consequently increasing manufacturing costs.

In an advantageous manner, a multi-doped junction may be formed on a substrate using a simultaneous diffusion step by incorporating doped Group IV nanoparticles as a high concentration dopant layer and dopant diffusion source. In the case of a selective emitter, the first and second diffused region are the same dopant type (both n-type or both p-type), while in the case of a BSF the diffused regions may be formed using either dopant types (n-type and/or p-type). Both the selective emitter and the BSF may also be formed in a simultaneous diffusion step.

In general, a nanoparticle is a microscopic particle with at least one dimension less than 100 nm. The term "Group IV nanoparticle" generally refers to hydrogen terminated Group IV nanoparticles having an average diameter between about 1 nm to 100 nm, and composed of silicon, germanium, carbon, or combinations thereof. The term "Group IV nanoparticle" also includes Group IV nanoparticles that are doped. In comparison to a bulk material (>100 nm) which tends to have constant physical properties regardless of its size (e.g., melting temperature, boiling temperature, density, conductivity, etc.).

Because of their small size, nanoparticles also tend to be difficult to manipulate. Consequently, in an advantageous manner, assembled nanoparticles may be suspended in a colloidal dispersion or colloid, such as an ink, in order to transport and store the nanoparticles. Generally, colloidal dispersions of Group IV nanoparticles are possible because the interaction of the particle surface with the solvent is strong enough to overcome differences in density, which usually result in a material either sinking or floating in a liquid. That is, smaller nanoparticles disperse more easily than larger nanoparticles.

In general, the Group IV nanoparticles are transferred into the colloidal dispersion under a vacuum, or an inert substantially oxygen-free environment. In addition, the use of particle dispersal methods and equipment such as sonication, high shear mixers, and high pressure/high shear homogenizers may be used to facilitate dispersion of the nanoparticles in a selected solvent or mixture of solvents.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics such as viscosity, density, polarity, etc.

In addition, in order to better disperse the Group IV nanoparticles in the colloidal dispersion, nanoparticle capping groups may be formed with the addition of organic compounds, such as alcohols, aldehydes, ketones, carboxylic acids, esters, and amines, as well as organosiloxanes. Alternatively, capping groups may be added in-situ by the addition of gases into the plasma chamber. These capping groups may be subsequently removed during the sintering process, or in a lower temperature pre-heat just before the sintering process.

For example, bulky capping agents suitable for use in the preparation of capped Group IV semiconductor nanoparticles include C4-C8 branched alcohols, cyclic alcohols, aldehydes, and ketones, such as tertiary-butanol, isobutanol, cyclohexanol, methyl-cyclohexanol, butanal, isobutanal, cyclohexanone, and oraganosiloxanes, such as methoxy(tris(trimethylsilyl) silane)(MTTMSS), tris(trimethylsilyl) silane (TTMSS), decamethyltetrasiloxane (DMTS), and trimethylmethoxysilane (TMOS).

Once formulated, the colloidal dispersion may be applied to a substrate and subjected to a heat treatment in order to sinter the Group IV nanoparticles into a densified conductive film and diffuse the dopant into the wafer. Examples of application methods include, but are not limited to, roll coating, slot die coating, gravure printing, flexographic drum printing, and inkjet printing methods, etc.

Additionally, various configurations of doped Group IV nanoparticle colloidal dispersions can be formulated by the selective blending of doped, undoped, and/or differently doped Group IV nanoparticles. For example, various formulations of blended Group IV nanoparticle colloidal dispersions can be prepared in which the dopant level for a specific layer of a junction is formulated by blending doped and undoped Group IV nanoparticles to achieve the requirements for that layer. Alternatively, the blended Group IV nanoparticle colloidal dispersions may be used to compensate for substrate defects, such as the passivation of oxygen atoms in order to reduce undesirable energy states.

Referring now to FIGS. 1A-F, a simplified set of diagrams showing an optimized method for forming a multi-doped junction on a substrate, such as a solar cell with a selective emitter (using the same dopant type) or BSF (using different dopant types), with a simultaneous diffusion step, in accordance with the invention.

In FIG. 1A, a doped set of nanoparticles 100 is deposited on doped silicon substrate 102 surface using application methods such as roll coating, slot die coating, gravure printing, flexographic drum printing, inkjet printing methods, etc. After deposition of doped nanoparticles the silicon substrate may be baked in order to remove residual solvents at a baking temperature (preferably from 100° C. to 500° C., more preferably between about 350° C. and about 450° C., and most preferably about 400° C.). This baking may be performed in an air ambient or in an inert ambient such as with a nitrogen gas, argon gas or forming gas.

Figure 1B:
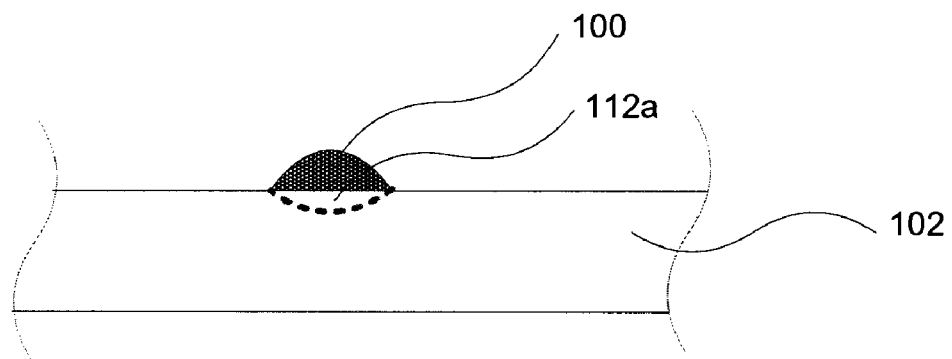

In FIG. 1B, doped silicon substrate 102 is positioned in a sintering furnace (e.g. quartz tube furnace, belt furnace etc). Optionally, an additional heat process may be used to pre-sinter the particles prior to diffusion to improve the formation of a low recombination ohmic contact. For example, doped set of nanoparticles 100 may be sintered at a sintering temperature (preferably between about 500° C. and about 1000° C., more preferably between about 750° C. and 850° C., and most preferably about 800° C.) and for a sintering time (preferably between about 5 seconds and about 2 minutes, more preferably between about 5 seconds and about 20 seconds, and most preferably at about 15 seconds with an inert ambient (such as nitrogen, argon, etc)) in order to form a densified thin film. Additionally, as the densified film is formed, dopant atoms in doped set of nanoparticles 100 may also begin to diffuse into doped silicon substrate 102 to form the initial first doped (higher dopant concentration) area 112a.

In addition, in the case of a solar cell, a BSF may be applied to the rear surface of doped silicon substrate in order to repel minority carriers in the absorber region from high recombination zones at the rear surface and metallized regions of the wafer. The BSF may be formed using aluminum paste (or other deposited materials) which is generally first screen printed onto the back of a solar cell and then co-fired in a belt furnace along with the front side metal contacts.

Figure 1C:
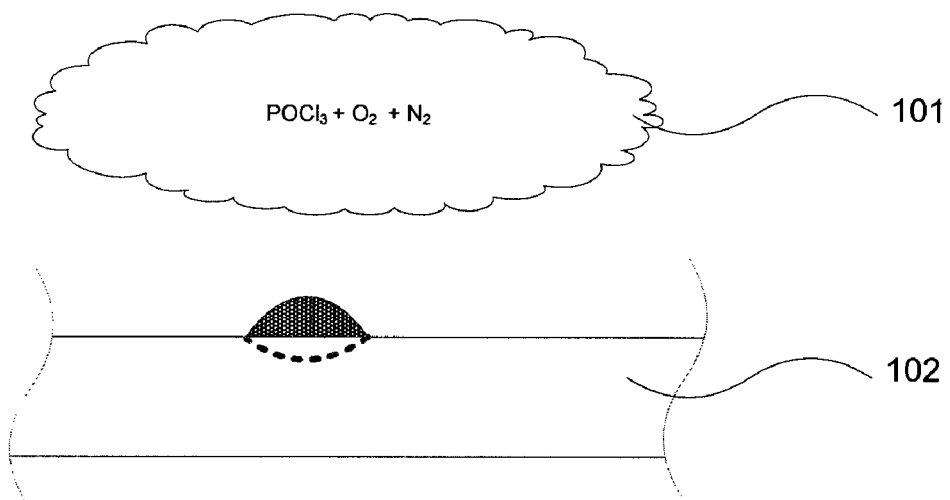

In FIG. 1C, a simultaneous diffusion step is started. Doped silicon substrate 102 is loaded into a diffusion furnace and heated to a diffusion temperature (preferably between about 700° C. and about 1000° C. and between about 5 minutes and about 30 minutes, and more preferably between about 750° C. and about 850° C. and for between 10 and 20 minutes, and most preferably about 800° C. and for about 15 minutes.

During which time, nitrogen is flowed as a carrier gas through a bubbler filled with a low concentration liquid POCl$_3$ (phosphorus oxychloride), O$_2$ gas, and N$_2$ gas to form a processing gas 101.

Figure 1D:
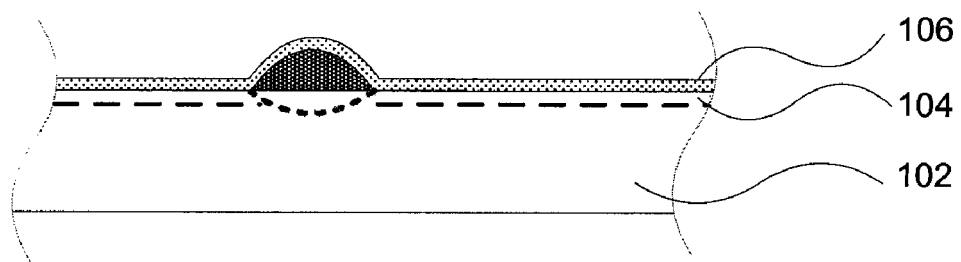

In FIG. 1D, during the thermal process of FIG. 1C, O$_2$ molecules react with POCl$_3$ molecules to form PSG (phosphorous silicate glass) layer 106, comprising P$_2$O$_5$ (phosphorus oxide), on doped silicon substrate 102. Cl$_2$ gas, produced as a byproduct, interacts with and removes metal impurities in doped silicon substrate 102. As the chemical process continues, phosphorus diffuses into the silicon wafer to form the second doped (lower dopant concentration) area 104.

Figure 1E:
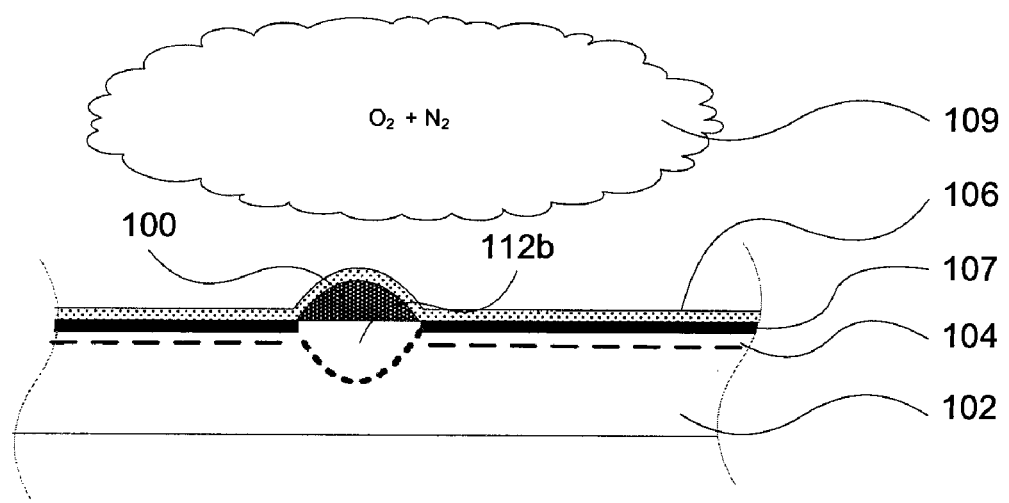

In FIG. 1E, a second oxidizing gas 109 is formed using O$_2$ and N$_2$. The furnace chamber is first heated to an oxidizing temperature (preferably between about 800° C. to about 1100° C., more preferably between about 950° C. and about 1050° C., and most preferably about 1000° C.). SiO$_2$ (silicon dioxide) layer 107 (about 10-50 nm) is then formed (at a N$_2$:O$_2$ mixture of about 1:1) as a result of oxygen gas reacting with silicon atoms in doped silicon substrate 102 surface.

Once a sufficient SiO$_2$ thickness has been achieved, for example after 15 to 30 minutes, the O$_2$ gas flow is terminated. The quartz chamber is then heated to between about 900° C. and 1100° C. in a N$_2$ ambient in order to drive the dopant atoms originally in the doped set of nanoparticles 100 deeper into doped silicon substrate 102 to form the final first doped (higher dopant concentration) area 112b. That is, unlike dopant atoms in PSG layer 106 that are prevented from entering silicon substrate 102 by SiO$_2$ layer 107, dopant atoms in doped set of nanoparticles 100 may continue to diffuse into first doped area 112b. Consequently, the diffusion depth of final first doped area 112b may be substantially greater than the corresponding diffusion depth of second doped area 104, minimizing the likelihood of shunting caused by the penetration of a front-metal contact (as shown in FIG. 4) into the lightly counter-doped substrate.

Figure 1F:
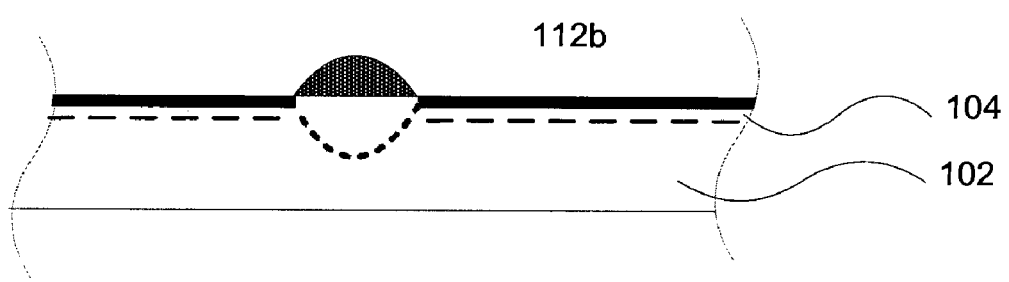

In FIG. 1F, if required, PSG layer 206 may be removed using a batch HF wet bench or other suitable means.

Referring now to FIGS. 2A-G, a simplified set of diagrams showing an optimized method for forming a selective emitter with a nanoparticle BSF in a simultaneous diffusion step, in accordance with the invention.

Figure 2A:
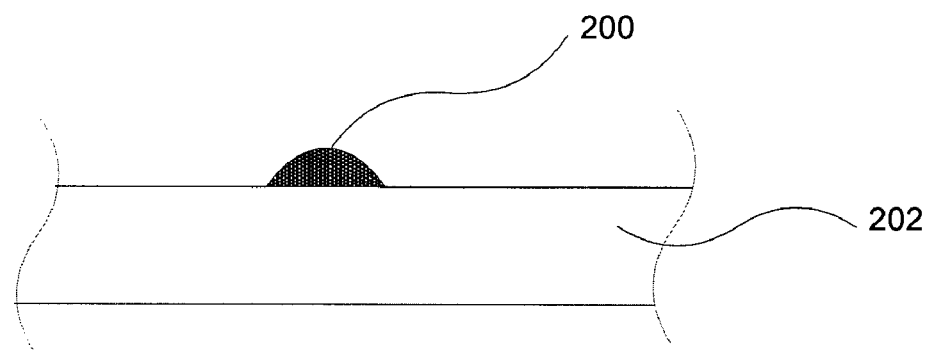
FIGS. 2A-G show a simplified set of diagrams of an optimized method for forming a selective emitter with a nanoparticle BSF in a simultaneous diffusion step, in accordance with the invention.

In FIG. 2A, a highly doped n-type nanoparticle layer 200 is deposited on the front surface of a p-doped silicon substrate 202 using application methods such as roll coating, slot die coating, gravure printing, flexographic drum printing, inkjet printing methods, etc. After deposition, the silicon substrate may be baked in order to remove residual solvents at a first baking temperature (preferably from about 100° C. to about 500° C., more preferably between about 350° C. and about 450° C., and most preferably about 400° C.). Baking may be performed in an air ambient or in an inert ambient such as with a nitrogen gas, argon gas or forming gas.

Figure 2B:
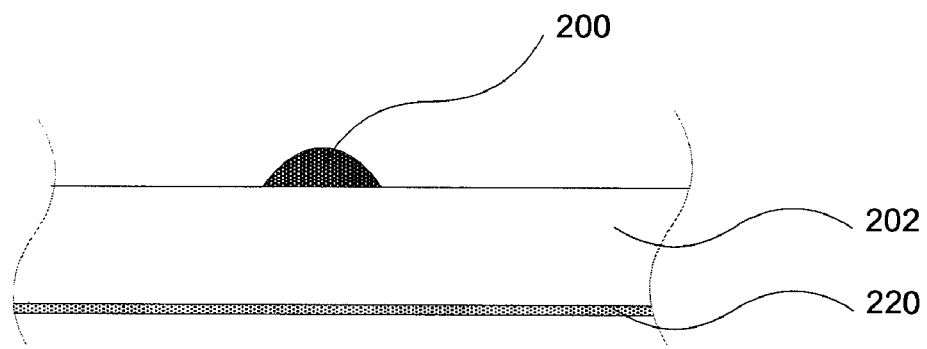

In FIG. 2B, highly doped p-type nanoparticle layer 220 is then deposited on the back surface of a p-doped silicon substrate 202 to form a BSF (as well as to form an ohmic contact with the rear metal contact (rear electrode grid)), also using application methods such as roll coating, slot die coating, gravure printing, flexographic drum printing, inkjet printing methods, etc.

P-doped silicon substrate 202 is then baked in order to remove residual solvents in highly doped p-type nanoparticle layer 220 at a second baking temperature (preferably from about 100° C. to about 500° C., more preferably between about 350° C. and about 450° C., and most preferably about 400° C.). This baking may be performed in an air ambient or in an inert ambient such as with a nitrogen gas, argon gas or forming gas.

Figure 2C:
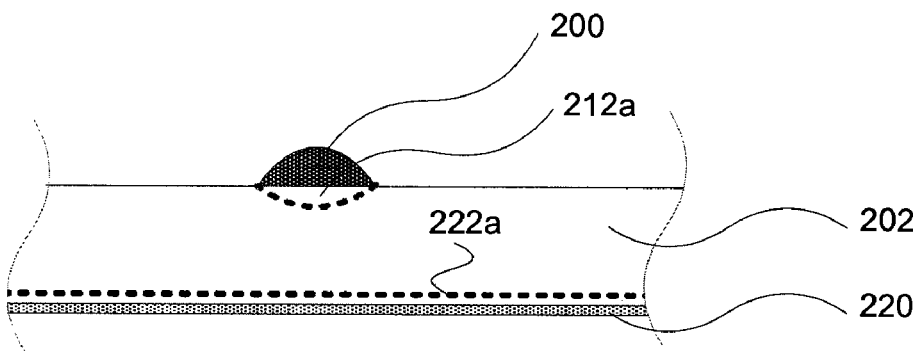

In FIG. 2C, a simultaneous diffusion step is started. P-doped silicon substrate 202 is positioned in a furnace (e.g. quartz tube furnace, belt furnace, etc.). Optionally, an additional heat process may be used to pre-sinter the particles prior to diffusion to improve the formation of a low recombination ohmic contact.

Consequently, n-type doped nanoparticles 200 and p-type doped nanoparticles 220 may then be simultaneously sintered with an inert ambient at a sintering temperature in order to each form a densified thin film (preferably between about 500° C. and about 1000° C., more preferably about 750° C. and about 850° C., and most preferably about 800° C.) and for a sintering time (preferably about 5 seconds and about 2 minutes, more preferably about 5 seconds to about 20 seconds, and most preferably about 15 seconds) and in an inert ambient (e.g. $N_2$, Ar, forming gas).

As respective densified films are formed, n-dopant atoms in the set of n-type doped nanoparticles 200 begin to diffuse into p-doped silicon substrate 202 to form the initial n-doped high concentration area 212a, while p-dopant atoms in the set of p-type doped nanoparticles 220 also begin to diffuse into p-doped silicon substrate 202 to form the initial p-doped high concentration area 222a.

Figure 2D:
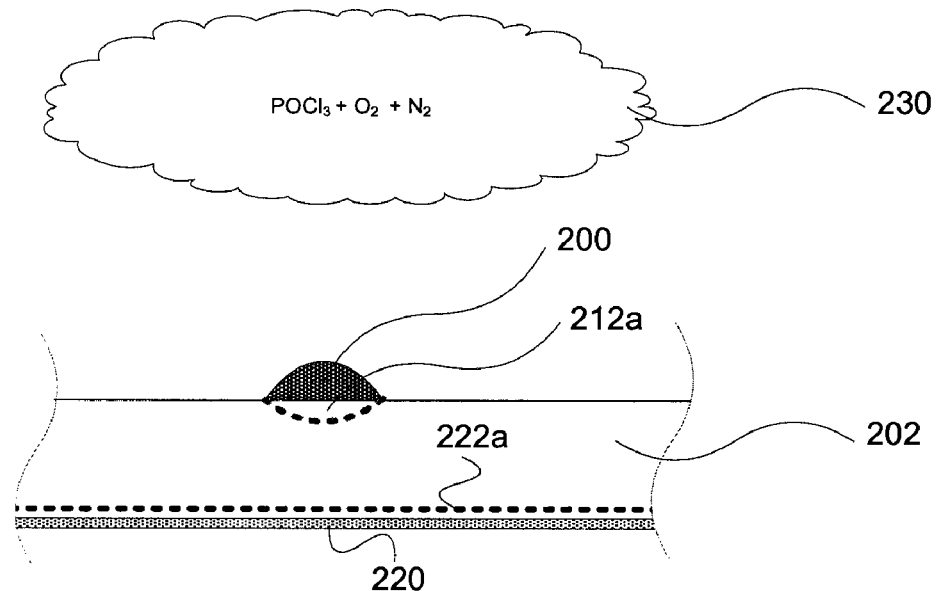

In FIG. 2D, p-doped silicon substrate 202 is heated to diffusion temperature (preferably between about 700° C. and about 1000° C. and between about 5 minutes and about 30 minutes, more preferably between about 750° C. and about 850° C. and for between 10 and 20 minutes, and most preferably about 800° C. and for about 15 minutes) during which time, nitrogen is flowed as a carrier gas through a bubbler filled with a low concentration liquid $POCl_3$ (phosphorus oxychloride), $O_2$ gas, and $N_2$ gas in order to form a processing gas 230.

Figure 2E:
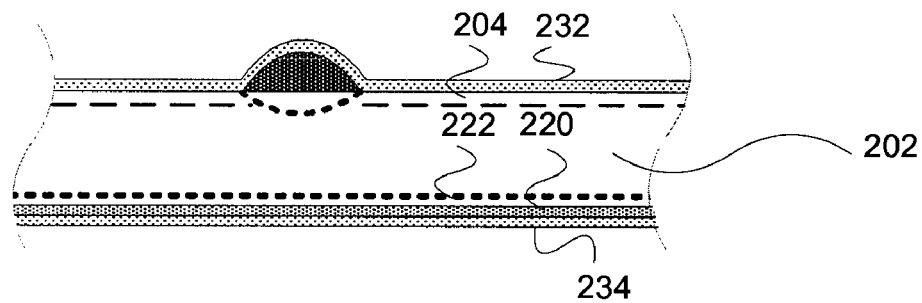

In FIG. 2E, as the thermal process as shown in FIG. 2D continues, $O_2$ molecules react with $POCl_3$ molecules to form front PSG layer 232 and rear PSG layer 234, both comprising $P_2O_5$ (phosphorus oxide), on p-doped silicon substrate 202. $Cl_2$ gas, produced as a byproduct, interacts with and removes metal impurities in p-doped silicon substrate 202. As the chemical process continues, phosphorus diffuses into the silicon wafer to form a front n-doped low concentration area 204. In addition, in solar cell configurations in which p-type doped nanoparticles layer 201 is patterned [not shown], phosphorus diffuses into the silicon wafer in areas generally without the p-type doped nanoparticles layer 201. Otherwise, a low concentration of phosphorous (n-type) diffuses into BSF layer 220, which has a substantially higher boron (p-type) dopant concentration.

Figure 2F:
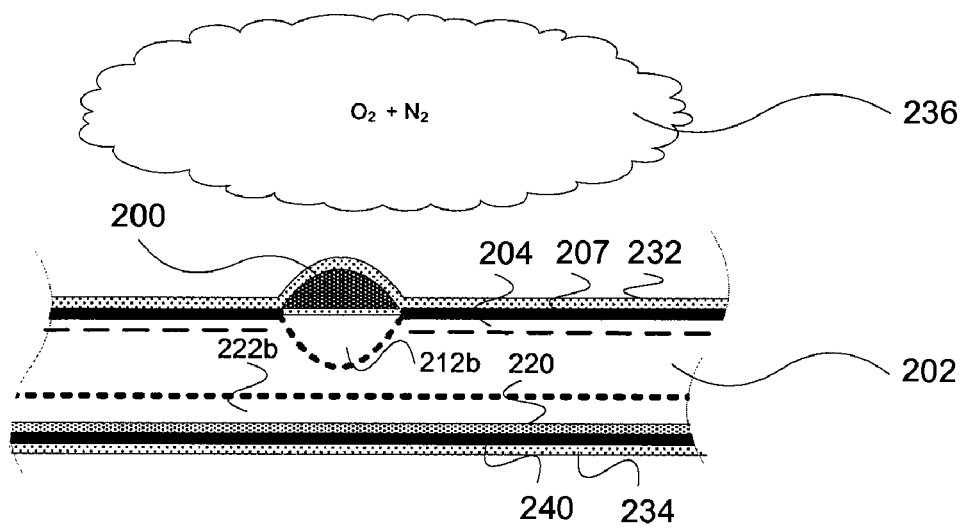

In FIG. 2F, a second oxidizing gas 236 is formed using $O_2$ and $N_2$. The furnace chamber is heated to an oxidation temperature (preferably between about 800° C. to about 1100° C., more preferably between about 950° C. and 1050° C., and most preferably at about 1000° C.) for between about 5 minutes and 30 minutes.

As the oxygen gas reacts with silicon atoms in p-doped silicon substrate 302, a front $SiO_2$ (silicon dioxide) layer 207 and a rear $SiO_2$ (silicon dioxide) layer 240, each about 10 nm to about 50 nm, are formed within p-doped silicon wafer 202. Once a sufficient $SiO_2$ thickness has been achieved, the $O_2$ gas flow is terminated.

The quartz chamber is then heated to a diffusion temperature of about 900° C. and 1100° C. and a diffusion time period (preferably between about 5 minutes and about 60 minutes, more preferably between 15 and 30 minutes, and most preferably for about 22 minutes) in an $N_2$ ambient in order to drive the dopant atoms (originally in n-type doped nanoparticle layer 200 and p-type doped nanoparticles layer 220), deeper into p-doped silicon substrate 202 to form final n-doped high concentration area 212a and final p-doped high concentration area 222b. As previously described, dopant atoms in front PSG layer 232 are prevented from further diffusing into p-doped silicon substrate 202 by front $SiO_2$ layer 207, while dopant atoms in rear PSG layer 234 are prevented from further diffusing into p-doped silicon substrate 202 by rear $SiO_2$ layer 240. Consequently, the diffusion depth of final n-doped high concentration area 212b may be substantially greater than the corresponding diffusion depth of a front n-doped low concentration area 204, minimizing the likelihood of shunting caused by the penetration of a front-metal contact (not shown) into the lightly counter-doped substrate.

Figure 2G:
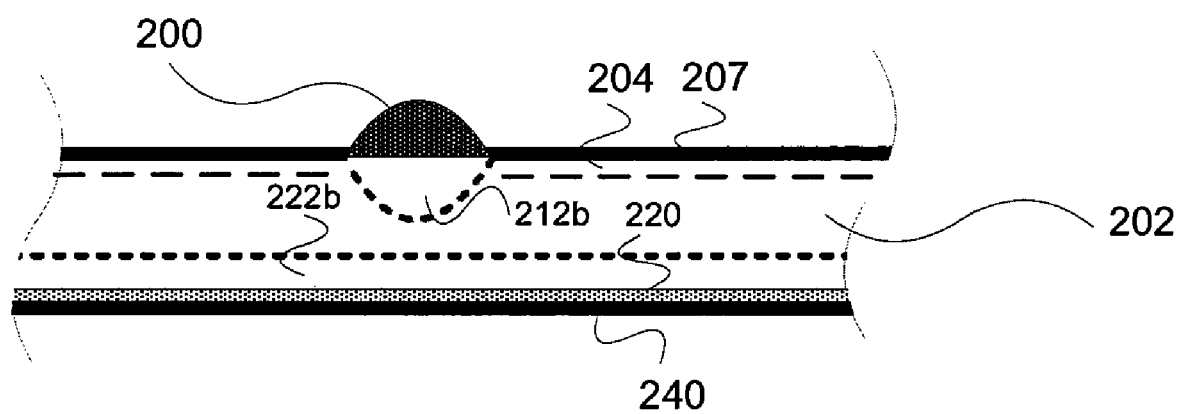

In FIG. 2G, if required, front PSG layer 232 and rear PSG layer 234 may be removed using a batch HF wet bench or other suitable means.

Referring now to FIGS. 3A-G, a simplified set of diagrams showing an optimized method for forming a selective emitter with a reduced area rear electrode contact and passivated rear surface, in a simultaneous diffusion step, in accordance with the invention.

Figure 3A:
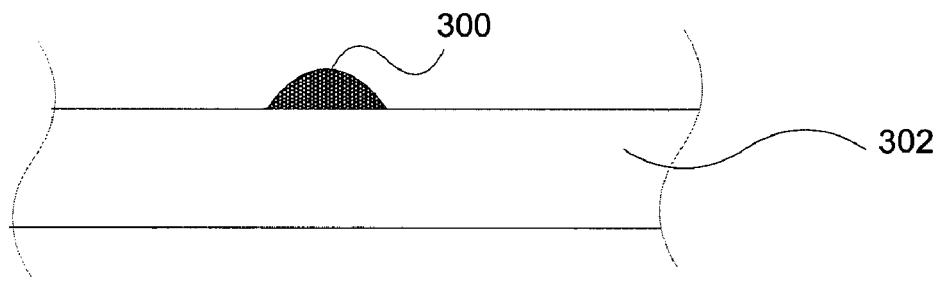
FIGS. 3A-G show a simplified set of diagrams of an optimized method for forming a selective emitter in a simultaneous diffusion step with a reduced area rear electrode contact and passivated rear surface, in accordance with the invention.

In FIG. 3A, a highly doped n-type nanoparticles layer 300 is deposited on the front surface of a p-doped silicon substrate 302 using application methods such as roll coating, slot die coating, gravure printing, flexographic drum printing, inkjet printing methods, etc. After deposition of doped nanoparticles the silicon substrate may be baked in order to remove residual solvents at a first baking temperature (preferably from about 100° C. to about 500° C., more preferably between about 350° C. and about 450° C., and most preferably about 400° C.).

This baking may be performed in an air ambient or in an inert ambient such as with a nitrogen gas, argon gas or forming gas. This set of n-type doped nanoparticles 300 will form the highly doped portion of the selective emitter.

Figure 3B:
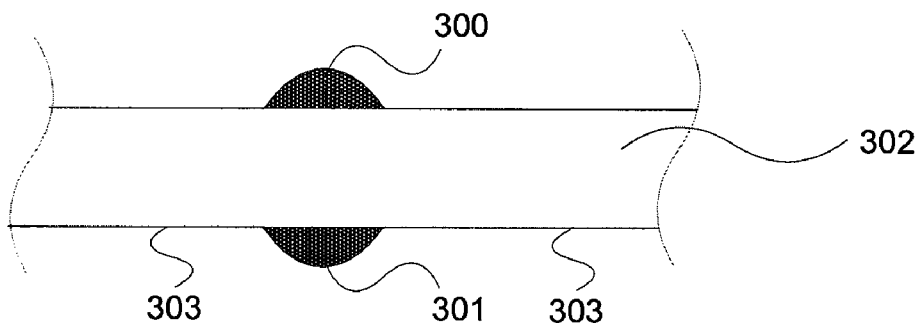

In FIG. 3B, a highly doped p-type nanoparticles layer 301 is then deposited on the back surface of a p-doped silicon substrate 302 to form the reduced area rear contact. Heavily doped to form an ohmic contact, the reduced area rear contact is generally deposed to match the rear electrode grid [not shown] (e.g. 120 um wide lines spaced at 2 mm intervals at right angles to a pair of 500 um wide busbar lines) also using application methods such as roll coating, slot die coating, gravure printing, flexographic drum printing, inkjet printing methods, etc. The remaining rear surface area 303 must generally be passivated in order to minimize losses due to recombination using $SiO_2$, $SiN_x$, or other techniques.

As before, after deposition of a n-type doped nanoparticle layer 300 and a p-type doped nanoparticles layer 301, p-doped silicon substrate 302 may be baked in order to remove residual solvents at a second baking temperature (preferably from about 100° C. to about 500° C., more preferably between about 350° C. and about 450° C., and most preferably about 400° C.). This baking may be performed in an air ambient or in an inert ambient such as with a nitrogen gas, argon gas or forming gas.

Figure 3C:
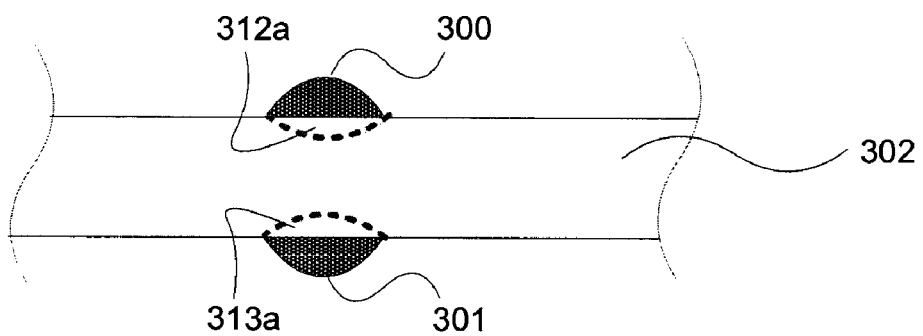

In FIG. 3C, p-doped silicon substrate 302 is positioned in a furnace (e.g. quartz tube furnace, belt furnace, etc.). Optionally, an additional heat process may be used to pre-sinter the particles prior to diffusion to improve the formation of a low recombination ohmic contact.

Consequently, n-type doped nanoparticles 300 and p-type doped nanoparticles 301 may then be simultaneously sintered with an inert ambient at a sintering temperature in order to each form a densified thin film (preferably between about 500° C. and about 1000° C., more preferably about 750° C. and about 850° C., and most preferably about 800° C.) and for a sintering time (preferably about 5 seconds and about 2 minutes, more preferably about 5 seconds to about 20 seconds, and most preferably about 15 seconds) and in an inert ambient (e.g. $N_2$, Ar, forming gas).

As respective densified films are formed, n-dopant atoms in the set of n-type doped nanoparticles 300 begin to diffuse into p-doped silicon substrate 302 to form the initial n-doped high concentration area 312a, while p-dopant atoms in the set of p-type doped nanoparticles 301 also begin to diffuse into p-doped silicon substrate 302 to form the initial p-doped high concentration area 313a.

Figure 3D:
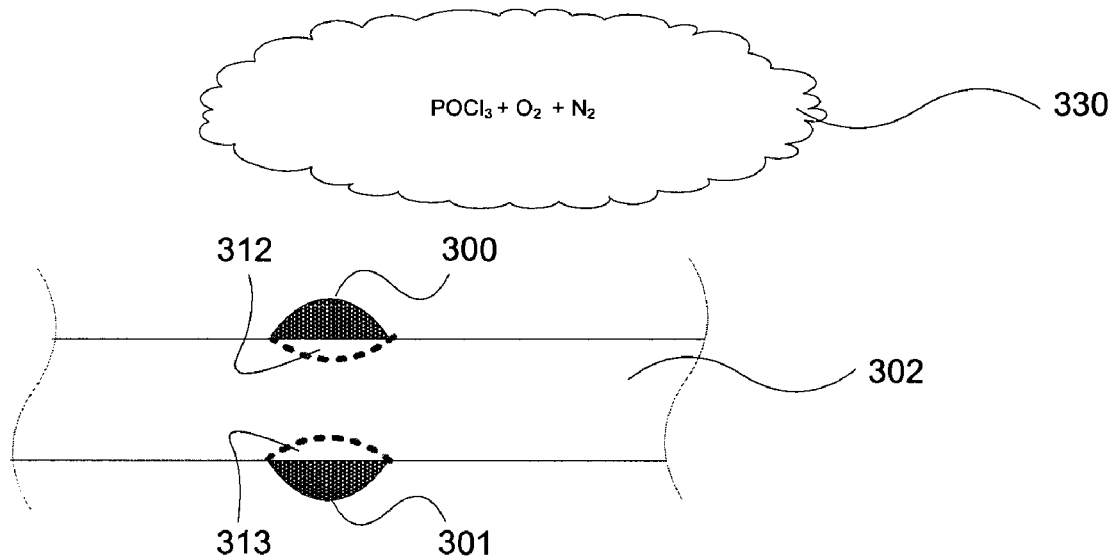

In FIG. 3D, a simultaneous diffusion step is started. P-doped silicon substrate 302 is loaded into a diffusion furnace and heated to diffusion temperature (preferably between about 700° C. and about 1000° C. and between about 5 minutes and about 30 minutes, more preferably between about 750° C. and about 850° C. and for between 10 and 20 minutes, and most preferably about 800° C. and for about 15 minutes) during which time, nitrogen is flowed as a carrier gas through a bubbler filled with a low concentration liquid $POCl_3$ (phosphorus oxychloride), $O_2$ gas, and $N_2$ gas in order to form a processing gas 330.

Figure 3E:
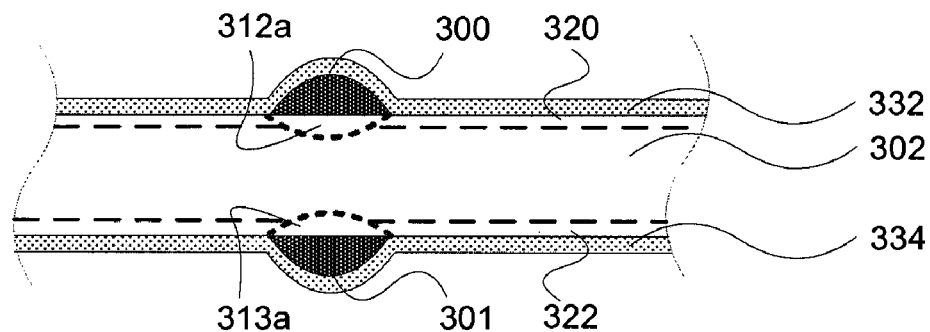

In FIG. 3E, as the thermal process as shown in FIG. 3D continues, $O_2$ molecules react with $POCl_3$ molecules to form front PSG layer 332 and rear PSG layer 334, both comprising $P_2O_5$ (phosphorus oxide), on p-doped silicon substrate 302. $Cl_2$ gas, produced as a byproduct, interacts with and removes metal impurities in p-doped silicon substrate 302. As the chemical process continues, phosphorus diffuses into the silicon wafer to form a front n-doped low concentration area 304 and rear n-doped low concentration area 322. As previously stated, low dopant concentration tends to minimize recombination.

Figure 3F:
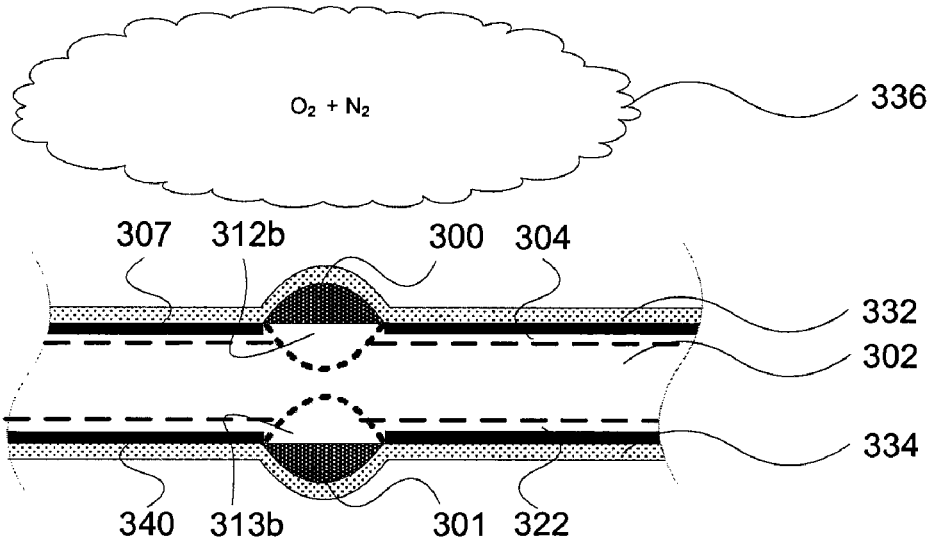

In FIG. 3F, a second oxidizing gas 336 is formed using $O_2$ and $N_2$. The furnace chamber is heated to an oxidation temperature (preferably between about 800° C. to about 1100° C., more preferably between about 950° C. and 1050° C., and most preferably at about 1000° C.) for between about 5 minutes and 30 minutes.

As the oxygen gas reacts with silicon atoms in p-doped silicon substrate 302, a front $SiO_2$ (silicon dioxide) layer 307 and a rear $SiO_2$ (silicon dioxide) layer 340, each about 10 nm to about 50 nm, are formed within p-doped silicon wafer 302. Once a sufficient $SiO_2$ thickness has been achieved, the $O_2$ gas flow is terminated.

The quartz chamber is then heated to a diffusion temperature of about 900° C. and 1100° C. and a diffusion time period (preferably between about 5 minutes and about 60 minutes, more preferably between 15 and 30 minutes, and most preferably for about 22 minutes) in an $N_2$ ambient in order to drive the dopant atoms (originally in n-type doped nanoparticle layer 300 and p-type doped nanoparticles layer 301), deeper into p-doped silicon substrate 302 to form final n-doped high concentration area 312b and final p-doped high concentration area 313b. As previously described, dopant atoms in front PSG layer 332 are prevented from further diffusing into p-doped silicon substrate 302 by front $SiO_2$ layer 307, while dopant atoms in rear PSG layer 334 are prevented from further diffusing into p-doped silicon substrate 302 by rear $SiO_2$ layer 340.

Figure 3G:
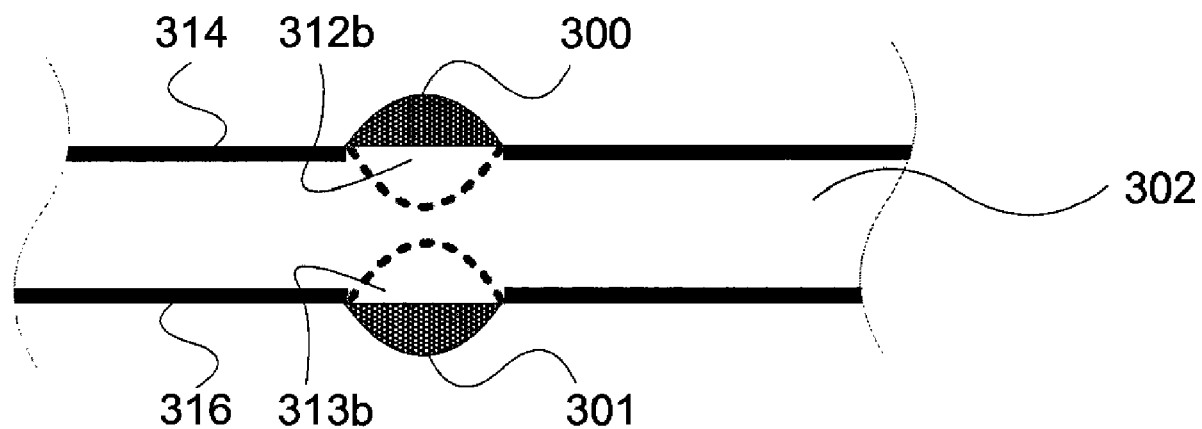

In FIG. 3G, if required, front PSG layer 332 and rear PSG layer 334 may be removed using a batch HF wet bench or other suitable means.

Referring now to FIG. 4, a simplified diagram of a solar cell with a selective emitter and aluminum BSF, in accordance with the invention. As previously described, n++ (highly doped) nanoparticle densified film 412 and n++ diffused region 414 is formed and sintered on p− (lightly doped) silicon substrate 410. N− diffused region 408 is then formed with a $POCl_3$ process. $SiO_2$ layer 406 is then formed above n− diffused region 408 in order to help passivate the front surface of silicon substrate 410, as well as to control the diffusion of phosphorous atoms during the $POCl_3$ process. $SiN_x$ 404 layer is formed on the front surface of $SiO_2$ layer 406. Like $SiO_2$ layer 406, $SiN_x$ layer 404 helps passivate the surface of silicon substrate 410, minimizing both contamination of the wafer bulk from external sources, as well as reducing minority carrier recombination at the surface of silicon substrate 410. Additionally, $SiN_x$ 404 layer may be optimized to reduce the reflectivity of the front surface of the solar cell, substantially improving efficiency and thus performance. Front-metal contact 402 and BSF/back metal contract 408 are then formed on silicon substrate 410. Front-metal contact 402 is generally formed from an Ag paste comprising Ag powder (70 to 80 wt %), lead borosilicate glass $PbO—B_2O_3—SiO_2$ (1 to 10 wt %), and organic components (15 to 30 wt %). BSF/back metal contract 408 is generally formed from aluminum, and is configured to create an electrical field that repels and thus minimize the impact of minority carrier rear surface recombination. In addition, Ag pads [not shown] are generally applied onto BSF/back metal contract 408 in order to facilitate soldering for interconnection into modules.

Figure 5:
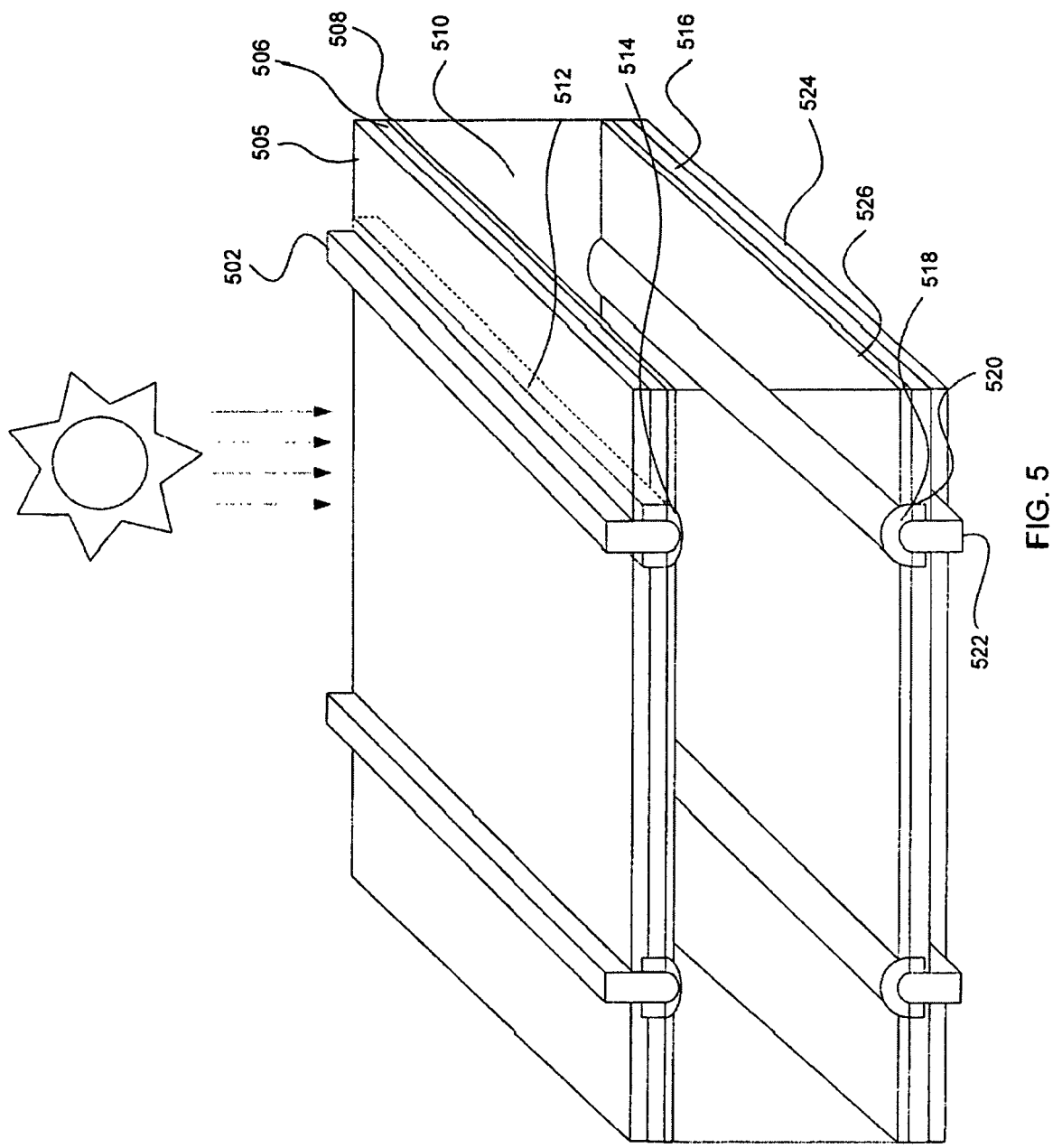
FIG. 5 shows a simplified diagram of a solar cell with a selective emitter and a densified film rear contact, in accordance with the invention.

Referring now to FIG. 5, a simplified diagram of a solar cell with a selective emitter and a densified film rear contact, in accordance with the invention. N++ (highly doped) nanoparticle densified film 512, n++ diffused region 514, p++ nanoparticle densified film rear contact 520, and p++ nanoparticle diffused region 518 are formed and sintered on p− (lightly doped) silicon substrate 510. Front n− diffused region 508 and rear n− diffused region 526 are then formed with a $POCl_3$ process. $SiO_2$ layer 506 is then formed above n− diffused region 508. $SiN_x$ 504 layer is then formed on the front surface of $SiO_2$ layer 506. Front-metal contact 502 and rear metal contract 408 are then formed on silicon substrate 510 using an Ag paste as previously described.

Figure 6:
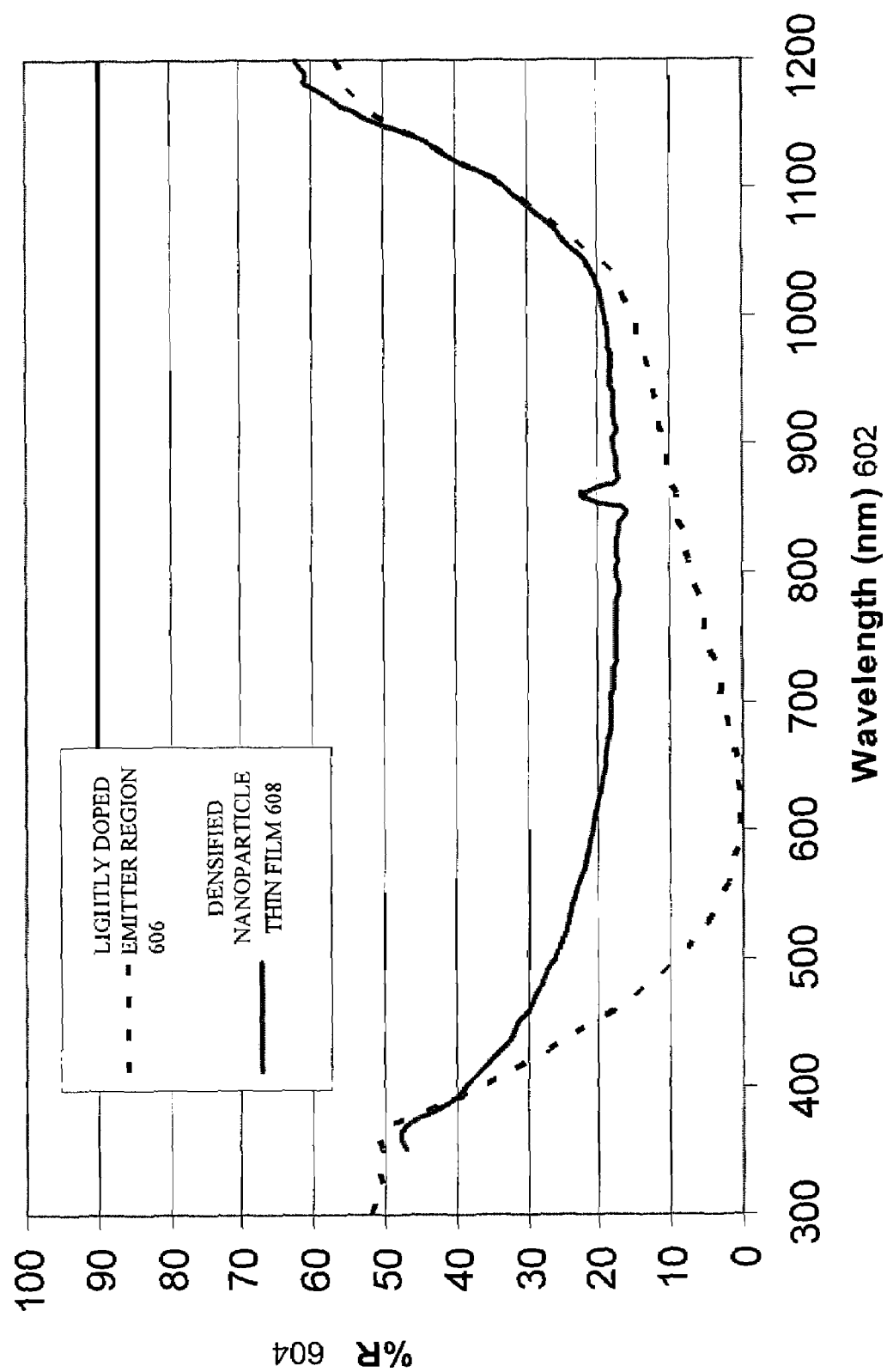
FIG. 6 shows a simplified diagram comparing the reflectivity of a densified nanoparticles film and crystalline silicon on a silicon substrate, in accordance with the invention.

Referring now to FIG. 6, a simplified diagram comparing the reflectivity of a densified nanoparticles film and crystalline silicon on a silicon substrate, in accordance with the invention. Both surfaces are coated with a layer of thermally grown oxide and PECVD deposited nitride as described above. Wavelength in nanometers is shown on horizontal axis 602 and percentage reflectance is shown on vertical axis 604.

As previously described, $SiN_x$ is often used to reduce the reflectivity of a solar cell, and thus increase its efficiency. For any given wavelength of light striking a solar cell, the percentage of reflectivity is related to the thickness of translucent layers through with the light passes, here principally the $SiN_x$ layer, and the absorption characteristics of the underlying surface.

In the case of a diffused selective emitter (without a densified nanoparticles film) as described in FIGS. 1A-F, the thickness of the $SiN_x$ layer and the underlying surface for both the lightly doped emitter region and the heavily doped emitter region is crystalline silicon (or crystalline silicon covered with a layer of thin thermally grown oxide) and thus the same. Thus visually aligning the front metal contact on the highly doped region may be problematic. However, in the current invention, the underlying surfaces are different and thus visually distinct. Although, lightly doped emitter region 606 has optical properties (i.e. extinction coefficient and refractive index) of crystalline silicon, densified nanoparticle thin film 608 has different optical properties that are somewhat similar to that of amorphous silicon. Here, the reflectivity of lightly doped emitter region 606 has a minimum reflection point around a wavelength of 600 nm resulting in a blue appearance, whereas the reflectivity of densified nanoparticle thin film 608 has no distinct minimum resulting in a white appearance. Consequently, since this difference in optical properties tends to make each surface a different color, with a high contrast between the colors, visually aligning the front metal contact on the highly doped region may be more easily done.

Figure 7A:
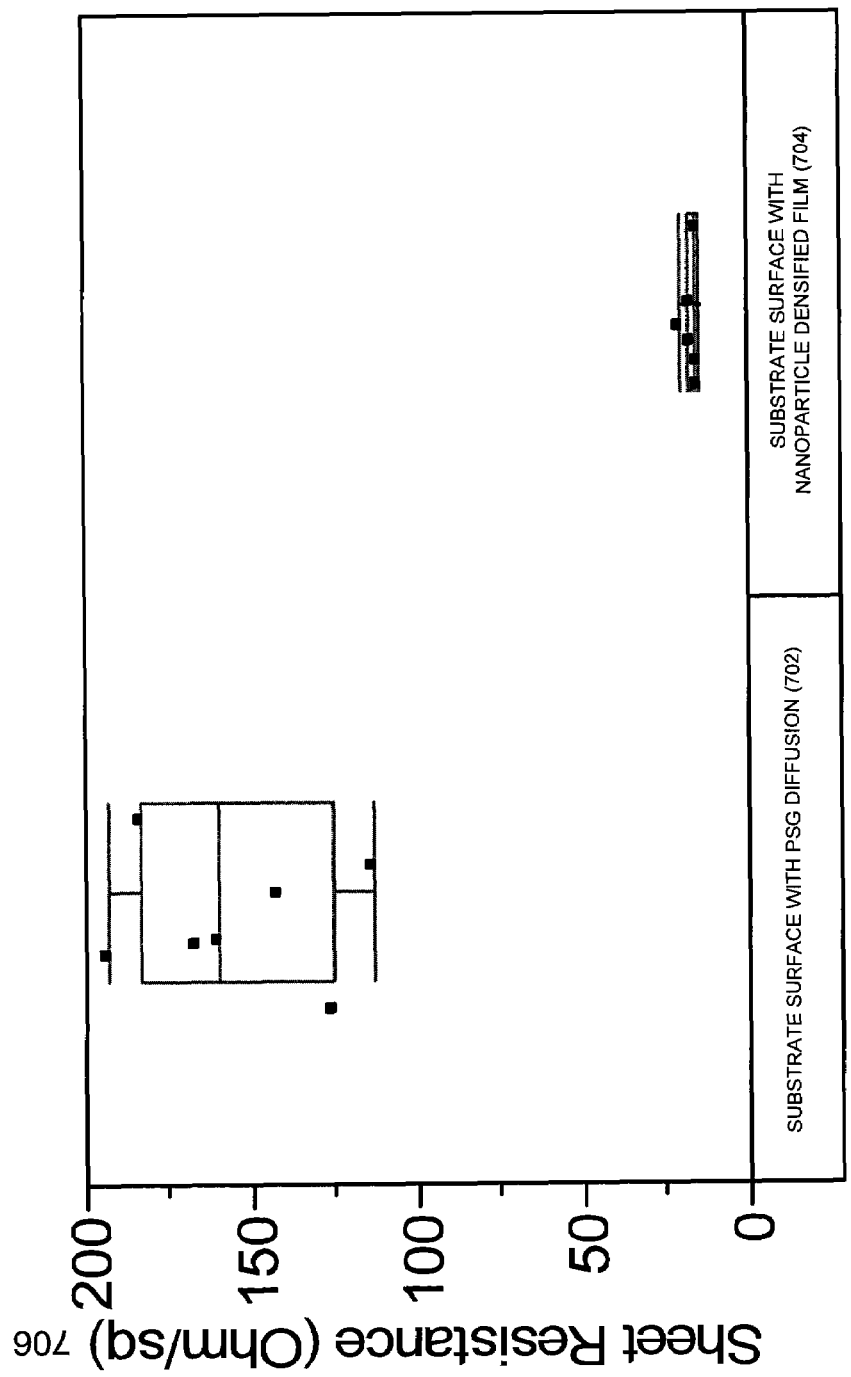
FIGS. 7A-C show a simplified diagram of various electrical characteristics for different regions of a selective emitter, in accordance with the invention; an FIG. 8 shows a simplified diagram of a set if I-V curves comparing a solar cell with just a lightly doped emitter to a solar cell with a selective emitter, in accordance with the invention.
Figure 7B:
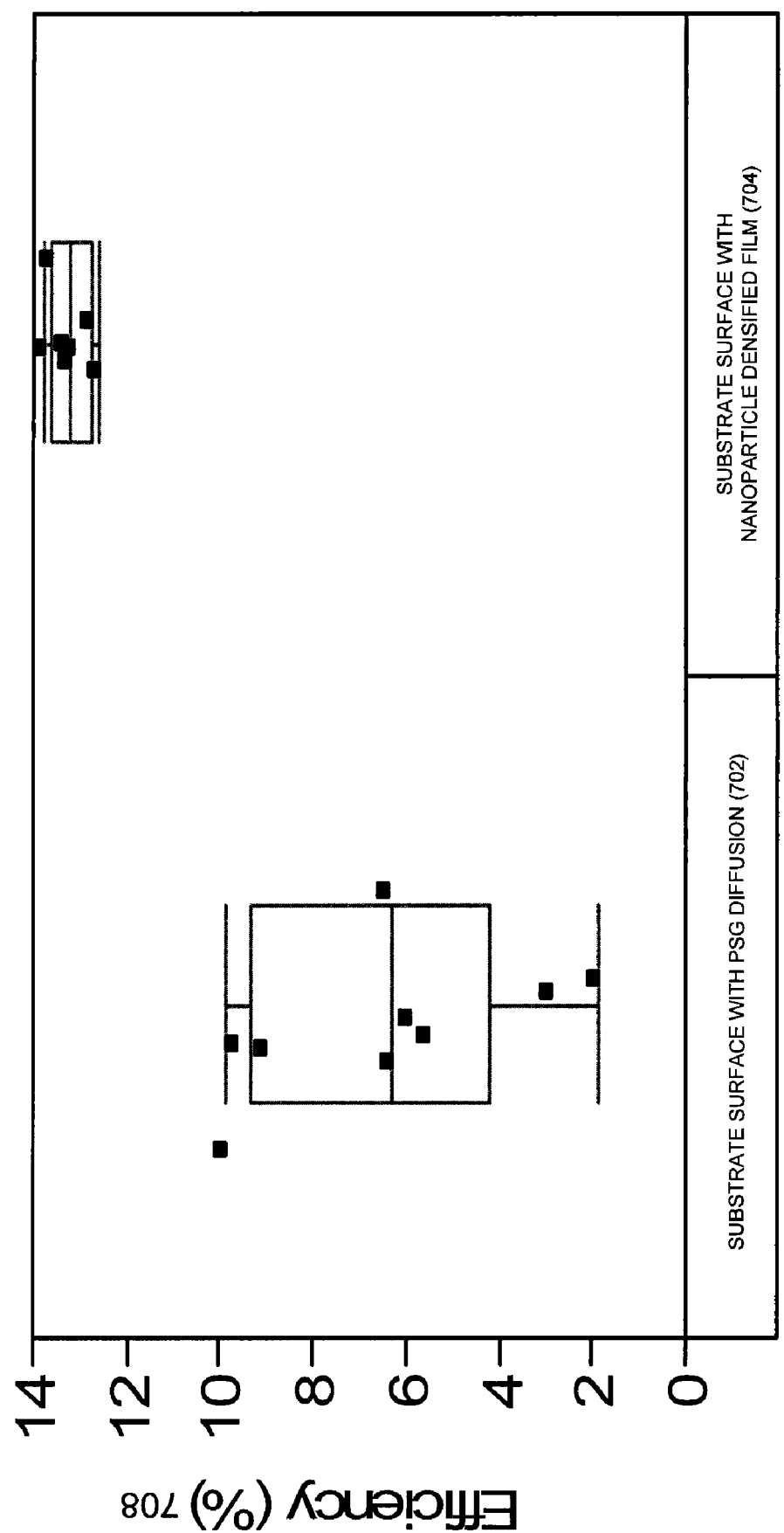
Figure 7C:
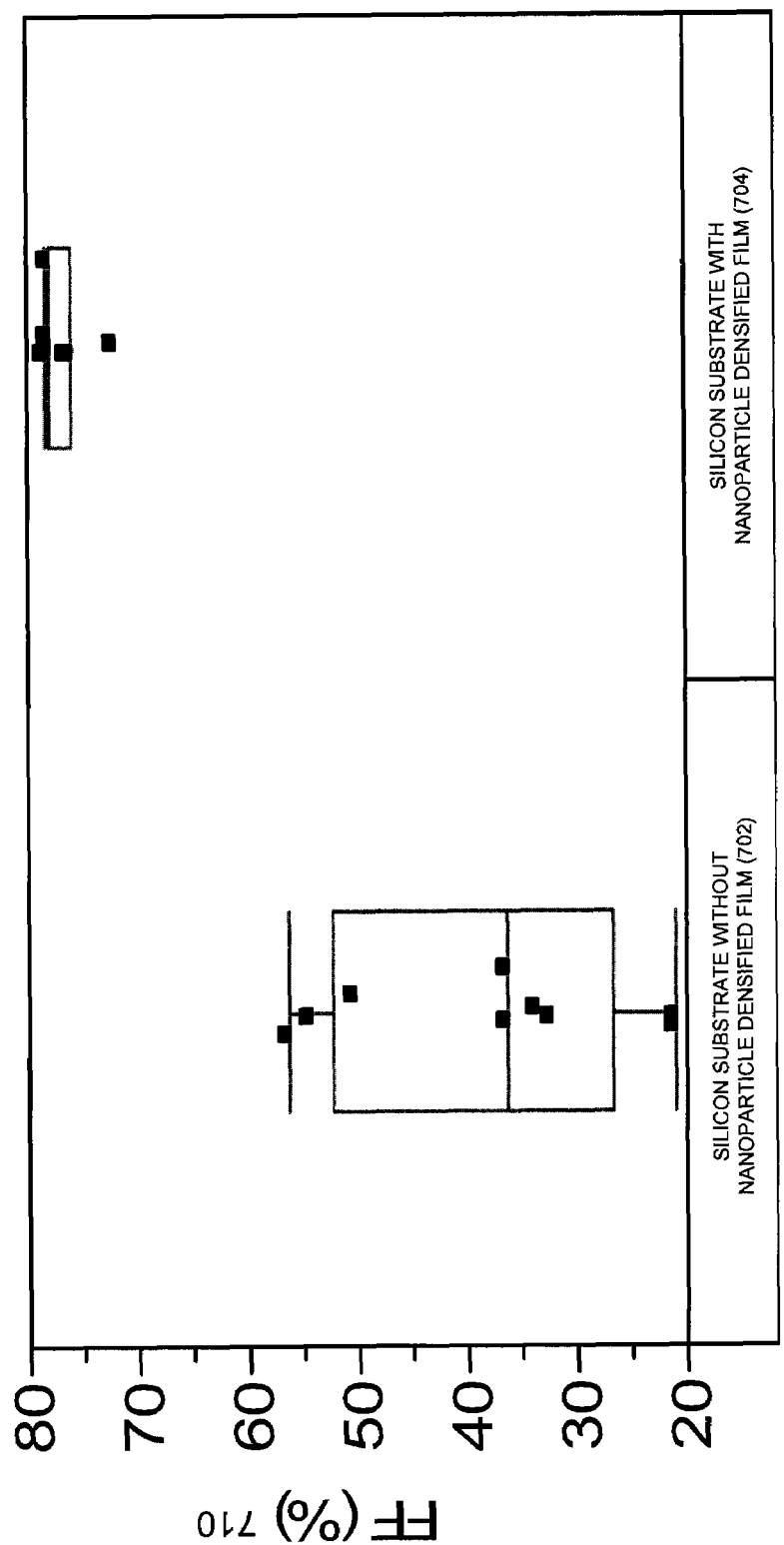

Referring now to FIGS. 7A-C, a simplified diagram showing various electrical characteristics for different regions of a selective emitter, in accordance with the invention. Here, a set of nanoparticles substrates were prepared on a lightly boron doped silicon substrate to facilitate 4-point probe measurements of the sheet resistance. Upon a first portion of the substrate surface, a phosphorous-doped nanoparticle densified film 704 was formed, and upon a second portion a phosphorous diffused region was formed using PSG 702.

In FIG. 7A, sheet resistance 706 was measured. Sheet resistance is generally a measure of the resistance of a thin film or layer that has a uniform thickness, and is measured in Ohm/sq. Here, the substrates were pre-sintered at 1000° C. for 20 seconds and diffused with a phosphorous deposition at 725° C. for 19 minutes followed by an oxidation at 975° C. for 15 minutes and an anneal at 1000° C. for 30 minutes. As can be seen, the regions that contain the nanoparticle densified have a sheet resistance between 10 and 20 Ohm/sq while regions with the PSG are between 120-200 Ohm/sq.

In FIG. 7B, efficiency 708 was measured. Solar cell efficiency is generally the percentage of power converted (from absorbed light to electrical energy) and collected, when a solar cell is connected to an electrical circuit. In general, the losses of a solar cell may be broken down into reflectance losses, thermodynamic efficiency, recombination losses and resistive electrical loss.

This term is calculated using the ratio of the maximum power point divided by the input light irradiance (in W/m$^2$) under standard test conditions (STC) and the surface area of the solar cell (m$^2$). STC specifies a temperature of 25° C. and an irradiance of 1000 W/m$^2$ with an air mass 1.5 (AM1.5) spectrum. Maximum power is the point that maximizes the product of current (I) and voltage (V). That is I×V.

Here, half of the substrates were printed with a nanoparticle ink pattern then sintered at 1000° C. for 20 seconds while the other half received no application of nanoparticle ink. The substrates were then diffused with a phosphorous deposition at 750° C. for 26 minutes followed by an oxidation at 975° C. for 15 minutes and an anneal at 1000° C. for 30 minutes. In this case the phosphorous doping strength in the region without ink was over 100 Ohm/sq and in the regions with ink was below 60 Ohm/sq. As can be seen, the regions that contain the nanoparticle densified have efficiency between about 12% and about 14%, while regions with the PSG are between about 2% and about 10%

In FIG. 7C, fill factor (FF) 710 was measured. Fill factor is the ratio of the maximum power divided by the product of the open circuit voltage ($V_{oc}$) and the short circuit current ($I_{sc}$). Here, half of the substrates were printed with a patterned nanoparticle ink then sintered at 800° C. for 20 seconds while the other half have no ink. The substrates were then diffused with a phosphorous deposition at 750° C. for 26 minutes followed by an oxidation at 975° C. for 15 minutes and an anneal at 1000° C. for 30 minutes. In this case the phosphorous doping strength in the region without ink was over 75 Ohm/sq and in the regions with ink was below 50 Ohm/sq. In all three cases the silicon nanoparticle ink has facilitated the formation of selective doping, with heavily doped regions formed in the areas of ink application. As can be seen, the regions that contain the nanoparticle densified have FF between about 75% and about 80%, while regions with the PSG are between about 55% and about 20%.

Figure 8:
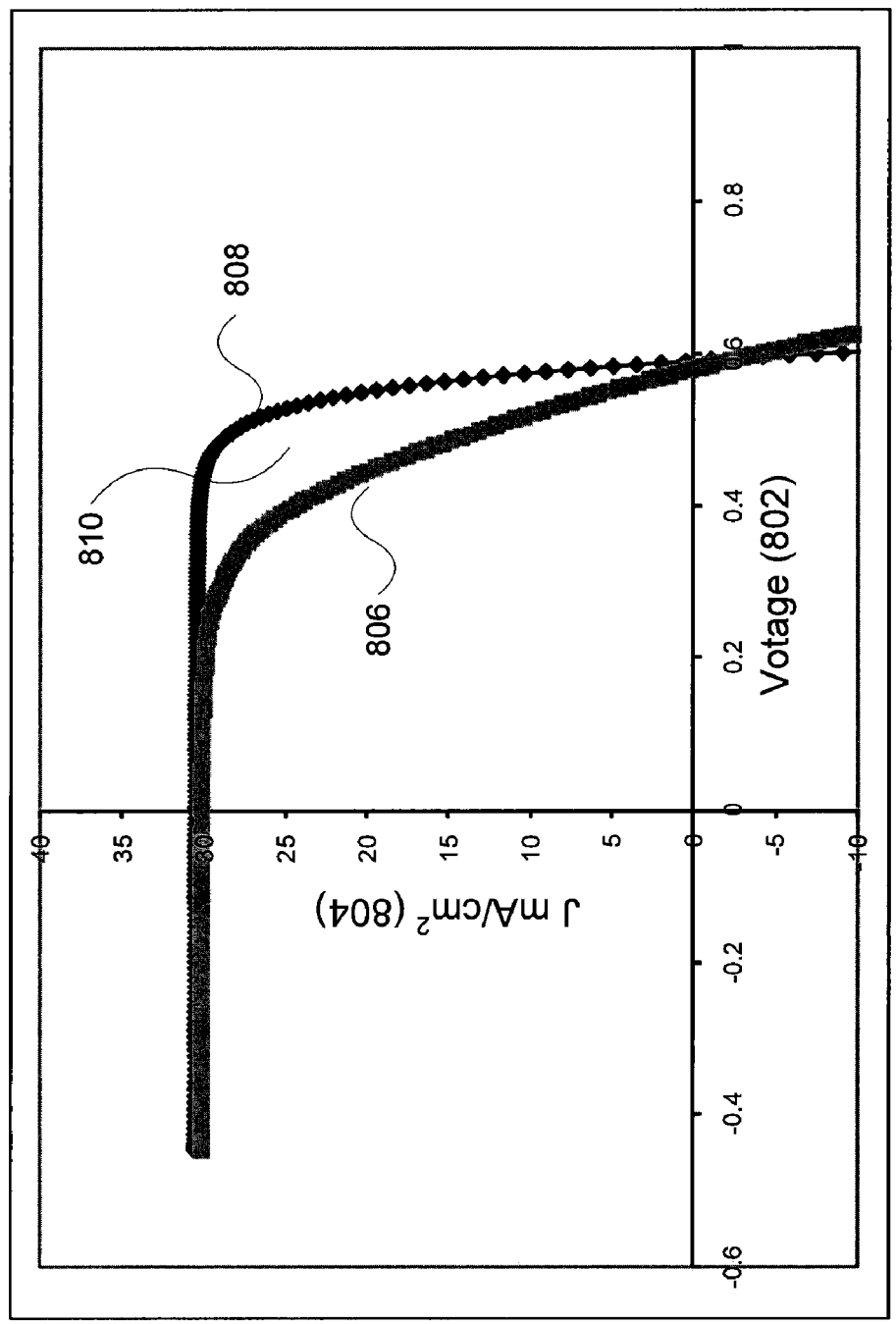

Referring now to FIG. 8, a simplified diagram of a set if I-V curves comparing a solar cell with just a lightly doped emitter to a solar cell with a selective emitter, in accordance with the invention. In general, as load is varied in a solar cell from near a short circuit (zero resistance) to near the open circuit (infinite resistance), an I-V curve may be plotted.

Here, voltage (V) is shown on horizontal axis 802 while current (J) is shown on the vertical axis 804. Plot 806 describes a lightly-doped emitter solar cell while plot 808 describes a heavily-doped nanoparticle densified film selective emitter. While both cells have a front-metal contact and a rear-metal contact as previously described, lightly-doped emitter solar cell 806 has a light uniform dopant concentration throughout the silicon substrate, including the area beneath the front-metal contacts. In contrast, heavily-doped nanoparticle densified film selective emitter 808 has heavily-doped region underneath the front-metal contacts, and lightly-doped regions on substantially the remaining portions of the solar cell. Consequently, heavily-doped nanoparticle densified film selective emitter 808 makes a better ohmic (low resistivity) contact with the front-metal contacts, corresponding to a net greater efficiency. This may be seen by area 810 on the chart, reflecting the net gain in power (and thus efficiency) enabled by the heavily-doped nanoparticle densified film.

Thus, in an advantageous manner, a selective emitter may be formed with a nanoparticle densified thin film, such that substantially high bulk lifetime and good surface recombination current density may be achieved.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention. Advantages of the invention include the production of low cost and efficient junctions for electrical devices, such as solar cells.

Having disclosed exemplary embodiments and the best mode, modifications and variations may be made to the disclosed embodiments while remaining within the subject and spirit of the invention as defined by the following claims.

What is claimed is:

1. A method of forming a multi-doped junction on a substrate, the method comprising:
   providing the substrate doped with boron, the substrate having a front surface with a first surface region and a second surface region;
   depositing a first set of nanoparticles comprising a first dopant on the first surface region;
   heating the substrate in an inert ambient to a first temperature for a first time period, thereby creating a first densified film and a first diffused region having a first diffusion depth in the substrate beneath the first surface region;
   exposing the substrate to a diffusion gas comprising phosphorous at a second temperature and for a second time period, thereby creating a PSG layer on the second surface region of the front surface and a second diffused region having a second diffusion depth in the substrate beneath the second surface region, wherein the first diffused region is proximate to the second diffused region; and
   exposing the substrate to an oxidizing gas at a third temperature and for a third time period, thereby forming a SiO$_2$ layer between the PSG layer and the front surface and increasing the first diffusion depth relative to the second diffusion depth.

2. The method of claim 1, wherein the first temperature is between about 500° C. and about 1000° C.

3. The method of claim 1, wherein the first temperature is between about 750° C. and 850° C.

4. The method of claim 1, wherein the first temperature is at about 800° C.

5. The method of claim 1, wherein the first time period is between about 5 seconds and about 2 minutes.

6. The method of claim 1, wherein the first time period is between about 5 seconds and about 20 seconds.

7. The method of claim 1, wherein the first time period is about 15 seconds.

8. The method of claim 1, wherein the diffusion gas comprises $POCl_3$, $O_2$, and $N_2$.

9. The method of claim 1, wherein the second temperature is between about 700° C. and about 1000° C., and the second time period is between about 5 minutes and about 30 minutes.

10. The method of claim 1, wherein the second temperature is between about 750° C. and about 850° C., and the second time period is between about 10 minutes and about 20 minutes.

11. The method of claim 1, wherein the second temperature is about 800° C. and the second time period is about 15 minutes.

12. The method of claim 1, wherein the third temperature is between about 800° C. and about 1100° C.

13. The method of claim 1, wherein the third temperature is between about 950° C. and about 1050° C.

14. The method of claim 1, wherein the third temperature is about 1000° C.

15. The method of claim 1, wherein the third time period is between about 15 minutes and about 30 minutes.

16. The method of claim 1, further comprising depositing a second set of nanoparticles comprising a second dopant on a third surface region of a rear surface of the substrate after depositing the first set of nanoparticles.

17. The method of claim 16, wherein the step of heating the substrate further creates a second densified film and a third diffused region having a third diffusion depth in the substrate beneath the third surface region.

18. The method of claim 17, wherein the first dopant is phosphorous, and the second dopant is boron.

19. The method of claim 1, further comprising depositing a first metal paste on a rear surface of the substrate before exposing the substrate to the diffusion gas.

20. The method of claim 19, wherein after exposing the substrate to the oxidizing gas, the method further comprises depositing at least one surface passivation layer on the front surface of the substrate and depositing a second metal paste on the at least one surface passivation layer.

21. A method of forming a multi-doped junction on a substrate, the method comprising:
providing the substrate doped with boron, the substrate having a front surface with a first surface region and a second surface region;
depositing a first set of nanoparticles comprising a first dopant on the first surface region;
exposing the substrate to a diffusion gas comprising phosphorous at a first temperature for a first time period, thereby creating a first diffused region having a first diffusion depth in the substrate beneath the first surface region, a PSG layer on the second surface region of the front surface, and a second diffused region having a second diffusion depth in the substrate beneath the second surface region; and
exposing the substrate to an oxidizing gas at a second temperature for a second time period, thereby forming a $SiO_2$ layer is formed between the PSG layer and the front surface and increasing the first diffusion depth relative to the second diffusion depth.

22. The method of claim 21, wherein the diffusion gas comprises $POCl_3$, $O_2$, and $N_2$.

23. The method of claim 21, wherein the first temperature is between about 700° C. and about 1000° C., and the first time period is between about 5 minutes and about 30 minutes.

24. The method of claim 21, wherein the first temperature is about 800° C. and the first time period is about 15 minutes.

25. The method of claim 21, wherein the second temperature is between about 800° C. and about 1100° C.

26. The method of claim 21, wherein the second temperature is about 1000° C.

27. The method of claim 21, wherein the second time period is between about 15 minutes and about 30 minutes.

28. The method of claim 21, further comprising depositing a second set of nanoparticles comprising a second dopant on a third surface region of a rear surface of the substrate after depositing the first set of nanoparticles, wherein the second dopant is a counter dopant to the first dopant.

29. The method of claim 28, wherein the first dopant is phosphorous, and the second dopant is boron.

30. The method of claim 21, further comprising depositing a first metal paste on a rear surface of the substrate after depositing the first set of nanoparticles.

31. The method of claim 30, wherein after exposing the substrate to the oxidizing gas, the method further comprises depositing at least one surface passivation layer on the front surface of the substrate and depositing a second metal paste on the at least one surface passivation layer.

\* \* \* \* \*